United States Patent
Janik et al.

(10) Patent No.: US 6,754,116 B2
(45) Date of Patent: Jun. 22, 2004

(54) TEST OF A SEMICONDUCTOR MEMORY HAVING A PLURALITY OF MEMORY BANKS

(75) Inventors: Thomas Janik, München (DE);
Sebastian Kuhne, Radebeul (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/198,575

(22) Filed: Jul. 18, 2002

(65) Prior Publication Data

US 2003/0016578 A1 Jan. 23, 2003

(30) Foreign Application Priority Data

Jul. 18, 2001 (DE) ......................................... 101 34 985

(51) Int. Cl.[7] ............................. G11C 7/00; G11C 29/00
(52) U.S. Cl. ................... 365/201; 365/189.04; 365/191
(58) Field of Search ............................. 365/201, 189.04, 365/191

(56) References Cited

U.S. PATENT DOCUMENTS 5,959,911 A 9/1999 Krause et al.

2002/0131315 A1 * 9/2002 Shirley et al. ......... 365/230.03

* cited by examiner

*Primary Examiner*—Van Thu Nguyen
(74) *Attorney, Agent, or Firm*—Laurence A. Greenberg; Werner H. Stemer; Ralph E. Locher

(57) ABSTRACT

A method and semiconductor circuit with which a self-test can be generated and tested with commands by which memory banks are interrogated simultaneously includes a processor for carrying out a built-in self-test and generating commands, each for testing only a respective single memory bank, and an additional processor connected downstream forms more complex multibank commands. Such multibank command formation enables a more diverse test of memories and is carried out faster. Principally, such multibank command generation using a combination of conventional single-bank commands has the advantage of not redeveloping a conventional BIST processor from scratch. It is necessary merely to connect a logic circuit downstream, with which conventional commands are combined, to form the multibank commands. As a result, complex self-test commands that simultaneously access a plurality of memory banks can be generated by a very low development outlay.

40 Claims, 3 Drawing Sheets

| | Column | 1 | 2 | 3 | 4 | 5 | 6 | 7 | 8 | 9 | 10 |
|---|---|---|---|---|---|---|---|---|---|---|---|
| I. | BIST-Processor | pattern I | | | | | | | | | |
| | Command | ACT | WR | PRE | NOP | ACT | WR | NOP | RD | PRE | NOP |
| | Row Address | row 1 | | row 1 | | row 2 | | | | row 2 | |
| | Column Address | | col 1 | | | | col 2 | | col 2 | | |
| | Data | | data 1 | | | | data 2 | | data 2 | | |
| II. | Post-Processor | pattern II | | | | | | | | | |
| | Command | ACT | ACTWR | PREWR | PRE | ACT | ACTWR | WR | RD | PRERD | PRE |
| a. | Bank Address ACT, PRE | bank A | bank B | bank A | bank B | bank A | bank B | | | bank A | bank B |
| | Row Address | row 1 | row 1 | row 1 | row 1 | row 2 | row 2 | | | row 2 | row 2 |
| b. | Bank Address RD, WR | | bank A | bank B | | | bank A | bank B | bank A | bank B | |
| | Column Address | | col 1 | col 1 | | | col 2 | col 2 | col 2 | col 2 | |
| | Data | | data 1 | data 3 | | | data 2 | data 4 | data 2 | data 4 | |

FIG 3A PRIOR ART

|   | Column | 1 | 2 | 3 | 4 | 5 | 6 | 7 | 8 | 9 | 10 |
|---|---|---|---|---|---|---|---|---|---|---|---|
|   | Command | ACT | WR | PRE | NOP | ACT | WR | NOP | RD | PRE | NOP |
| 1. | Bank Address ACT, PRE | bank A |  | bank A |  | bank A |  |  |  | bank A |  |
|   | Row Address | row 1 |  | row 1 |  | row 2 |  |  |  | row 2 |  |
|   | Bank Address RD, WR |  | bank A |  |  |  | bank A |  | bank A |  |  |
|   | Column Address |  | col 1 |  |  |  | col 2 |  | col 2 |  |  |
|   | Data |  | data 1 |  |  |  | data 2 |  | data 2 |  |  |
| 2. | Bank Address ACT, PRE | bank B |  | bank B |  | bank B |  |  |  | bank B |  |
|   | Row Address | row 1 |  | row 1 |  | row 2 |  |  |  | row 2 |  |
|   | Bank Address RD, WR |  | bank B |  |  |  | bank B |  | bank B |  |  |
|   | Column Address |  | col 1 |  |  |  | col 2 |  | col 2 |  |  |
|   | Data |  | data 3 |  |  |  | data 4 |  | data 4 |  |  |

FIG 3B

| | Column | 1 | 2 | 3 | 4 | 5 | 6 | 7 | 8 | 9 | 10 |
|---|---|---|---|---|---|---|---|---|---|---|---|
| I. | BIST-Processor pattern I | | | | | | | | | | |
| | Command | ACT | WR | PRE | NOP | ACT | WR | NOP | RD | PRE | NOP |
| | Row Address | row 1 | | row 1 | | row 2 | | | | row 2 | |
| | Column Address | | col 1 | | | | col 2 | | col 2 | | |
| | Data | | data 1 | | | | data 2 | | data 2 | | |
| II. | Post-Processor pattern II | | | | | | | | | | |
| | Command | ACT | ACTWR | PREWR | PRE | ACT | ACTWR | WR | RD | PRERD | PRE |
| a. | Bank Address ACT, PRE | bank A | bank B | bank A | bank B | bank A | bank B | | | bank A | bank B |
| | Row Address | row 1 | row 1 | row 1 | row 1 | row 2 | row 2 | | | row 2 | row 2 |
| b. | Bank Address RD, WR | | bank A | bank B | | | bank A | bank B | bank A | bank B | |
| | Column Address | | col 1 | col 1 | | | col 2 | col 2 | col 2 | col 2 | |
| | Data | | data 1 | data 3 | | | data 2 | data 4 | data 2 | data 4 | |

TEST OF A SEMICONDUCTOR MEMORY HAVING A PLURALITY OF MEMORY BANKS

BACKGROUND OF THE INVENTION

Field of the Invention

The invention relates to a method for testing a semiconductor memory having a plurality of memory banks, in which commands are generated and testing is effected to determine whether or not the commands are executed by the memory banks, single-bank commands for testing a respective single memory bank being generated and assigned to selected memory banks. The invention furthermore relates to a method for testing a semiconductor memory having the plurality of memory banks, single-bank commands for accessing a respective single memory bank being generated and executed for test purposes, and testing being effected to determine whether or not the commands are executed correctly by the memory banks.

The invention furthermore relates to a semiconductor circuit having a semiconductor memory including a plurality of memory banks. The semiconductor circuit has a built-in self-test (BIST) processor that generates single-bank commands for testing individual memory banks. The invention additionally relates to a semiconductor circuit having a semiconductor memory including memory banks and such a BIST processor.

Integrated semiconductor circuits with semiconductor memories often have an integrated switching unit that, upon start-up of the semiconductor circuit, automatically carries out a functional test of the integrated semiconductor memory. Such a switching unit is provided on many microprocessors and is designated according to its function as BIST because a microprocessor into which this switching unit is integrated automatically carries out a self-test of its own semiconductor memory when it is activated, i.e., supplied with current.

Furthermore, there are test devices with which memories of semiconductor circuits can be tested in a targeted manner. These test devices are very complicated and unwieldy and serve for carrying out more complex and more diverse functional tests on semiconductor memories in individual experiments.

Semiconductor circuits occasionally have a selection unit, a so-called multiplexer, with which either self-test signals generated on the test controller or external commands conducted into the test controller externally can be selected to carry out the memory test.

The switching unit for generating the self-test commands (BIST) and, if appropriate, the multiplexer are part of a test controller that is integrated as switching region into a semiconductor circuit such as, for instance, an application specific integrated circuit (ASIC). Commands output by the test controller are forwarded to the semiconductor memory, for example, to an embedded DRAM, and the execution of the commands by the DRAM is monitored and evaluated by the test controller. The test result lies in an indication of whether or not memory areas function as intended and, if appropriate, which memory areas do not function as intended.

Semiconductor memories usually include a plurality of memory areas that can be addressed independently of one another, the memory banks. The size of an integrated semiconductor memory depends on the number of memory banks present and on the number of memory cells per memory bank, expressed in the number of row addresses and column addresses. The number and memory size of the memory banks are determined by the application for which the semiconductor memory is used.

If a semiconductor memory is tested for its functionality, then the operations that each memory cell must be able to perform during the operation of the memory are carried out on a sample basis, commands being successively conducted to all the memory cells of the semiconductor memory and the correct execution of these commands being tested. In such a case, the commands "read" and "write" for the reading and writing of information items are tested, and also commands "activate" and "precharge" for activating and deactivating a memory cell for a write or read operation. Such a command constitutes a single-bank command because, at one point in time, it can only ever be used to test a single memory bank.

A plurality of single-bank commands are carried out successively by all the memory cells of a memory bank and successively in all the memory banks. As such, it is possible to test the basic functions of a memory cell in the entire memory.

During operation of the semiconductor circuit, however, the semiconductor operations to be formed are more complex. At a specific clock cycle time, it is usually not just a single memory cell that is addressed, but rather a plurality of memory cells and, in particular, those of different memory banks. By way of example, while an information item is stored in a memory cell of a first memory bank or is read from it, at the same time a memory cell of a second memory bank is prepared for the writing or reading of information items. Therefore, a plurality of memory banks is usually accessed at every clock cycle time.

Such an access has not been able to be carried out by testing heretofore. Above all, the switching units (BIST) developed for the automatic self-test are only able to generate commands for a memory cell of a single memory bank and to forward them to the relevant memory bank. These single-bank commands are not suitable, however, for testing more complex memory interrogations than the basic functions of an individual memory cell.

It would be desirable to be able also to simulate more complex accesses to a plurality of memory banks simultaneously for test purposes when a memory is activated. Such a process would necessitate new development of a test controller, for example, the BIST unit thereof for generating the command sequences so that commands that simultaneously address a plurality of memory banks are also generated.

Such a new development can only be achieved with a high outlay in respect of time and costs. So that the costs for the development of new integrated semiconductor circuits are kept low, a new development of the test controller, in particular, its BIST processor, is usually left out of consideration. As a result, the self-test as is performed on conventional BIST circuits remains limited to the single-bank commands.

SUMMARY OF THE INVENTION

It is accordingly an object of the invention to provide a test of a semiconductor memory having a plurality of memory banks that overcomes the hereinafore-mentioned disadvantages of the heretofore-known devices and methods of this general type and that enables a test in which memory cells of different memory banks of a semiconductor memory are addressed simultaneously by testing, and, at the same time, the costs and the outlay for such a test are kept low.

With the foregoing and other objects in view, there is provided, in accordance with the invention, a method for testing a semiconductor memory having a plurality of memory banks, including the steps of generating respective single-bank commands for testing a single one of the memory banks and assigning the commands to selected ones of the memory banks, combining a plurality of single-bank commands to form a multibank command, the single bank commands of the multibank command being executed simultaneously by the memory banks to which the single bank commands are respectively assigned, and effecting a test to determine if the selected ones of the memory banks jointly execute the multibank command.

According to the invention, a plurality of single-bank commands are combined to form a multibank command, as constituents of which they can be executed simultaneously by the various memory banks to which they are respectively assigned, and, in that, testing is effected to determine whether or not the selected memory banks jointly execute the multibank command.

According to the invention, multibank commands are formed that are required for test access to a plurality of memory banks simultaneously. However, these multibank commands are not generated directly, which would necessitate a complete new development of a test controller and of the method, i.e., its mode of operation. Instead, multibank commands are generated in two steps, in that, firstly single-bank commands—preferably those commands that test the basic functions of a single memory cell—are generated. In a second step, a plurality of such single-bank commands are combined with one another to form a test command that can access a plurality of memory banks simultaneously. For the generation of a single multibank command, a set of memory banks is selected, each of which is intended to execute in each case a single single-bank command. The single-bank commands to be executed are likewise selected. To generate the multibank command, the selected memory banks are in each case assigned to a single-bank command, or conversely the commands are assigned to the memory banks. The assigned single-bank commands are combined to form a single multibank command that is configured such that it initiates the simultaneous execution of the operations corresponding to the single-bank commands contained in it in the various memory cells of the selected memory banks.

According to the invention, these multibank commands are formed in a two-stage process in which firstly the single-bank commands, which can be generated with the aid of conventional methods and semiconductor circuits, are established, in the simplest case accepted from an output of a conventional BIST processor. Such a process makes it possible to have recourse to circuits and their modes of operation as have been used heretofore for generating commands for the basic operations of individual memory cells. In a second step, these available single-bank commands are combined and multibank commands are established therefrom. Only for this second step is it necessary to develop new methods and circuits. As a result, it becomes possible, with a very low development outlay, to generate complex commands that address a plurality of memory banks simultaneously, to forward such commands, and to test the interaction between different memory banks. The objectives on which the invention are based are thereby achieved.

With the objects of the invention in view, there is also provided a method for testing a semiconductor memory having a plurality of memory banks, including the steps of generating single-bank commands that access in each case a single memory bank and executing them for test purposes, testing being effected to determine whether or not the commands are executed correctly by the memory banks, and in which case a multibank command is executed that includes at least two single-bank commands and simultaneously accesses at least two memory banks, and testing being effected to determine whether or not the at least two memory banks correctly execute the at least two single-bank commands of the multibank command at the same time, i.e., simultaneously.

In accordance with another mode of the invention, testing is effected to determine whether or not a first memory bank correctly executes a first single-bank command even when a further, second single-bank command is executed by a second memory bank at the same time. Such a process makes it possible to detect even those defects that cannot be detected during the conventional test operation of individual memory banks even though, in conventional test methods, all the memory banks are individually tested one after the other and, therefore, an unidentified defect should no longer occur.

In accordance with a further mode of the invention, for a selection of memory banks, a sequence of multibank commands is formed that is configured such that the order of assigned single-bank commands that is contained therein is identical for each selected memory bank.

If a multibank command is transmitted to the semiconductor memory, each selected memory bank is allocated the single-bank command that is intended for it and is provided by the multibank command for such memory bank. At a fixed point in time, each memory bank is generally allocated another command. Accordingly, in a sequence of multibank commands, the sequence of those single-bank commands that an individual memory bank executes is generally different from memory bank to memory bank. The memory banks can execute an entirely different order of single-bank commands in one and the same time period. It is advantageous, however, if each memory bank executes the same sequence of commands in the course of the test because such a process enables a particularly simple evaluation of the test result. According to the above embodiment, therefore, a predetermined sequence of single-bank commands passes through all the memory banks—in a manner distributed between the various memory banks by the sequence of multibank commands.

In accordance with an added mode of the invention, the multibank commands are formed by assigning single-bank commands to different memory banks in a clock-cycle-time-offset manner, and by combining clock-cycle-time-identical single-bank commands assigned to different memory banks to form a respective multibank command.

Accordingly, a predetermined sequence of single-bank commands is assigned to the various selected memory banks in an unchanged order but in a temporally offset manner one after the other. What is thereby achieved in a simple manner is that each memory bank executes the same order of single-bank commands in the course of processing multibank commands. Maintaining the order of the single-bank commands generated in the first step does not preclude inserting pause clock cycles for one memory bank or a plurality of memory banks for the distribution of the single-bank commands between the multibank commands. A single command sequence suitable for the clock-cycle-time-offset assignment will often also contain pause clock cycles during which the state of the addressed memory bank remains unchanged. Preferably, however, the sequence of single-bank commands that is to be prescribed is suitably configured by the addition of pause clock cycles that it can be assigned to the memory banks unchanged in a temporally offset manner in the sequence of multibank commands.

If N memory banks are addressed simultaneously, then it is preferably provided that the multibank commands (II) that can be executed by the N selected memory banks are formed by a suitable sequence of single-bank commands (I) being assigned to the selected memory banks (A, B) in a manner offset by up to (N−1) clock cycle times. In such a case, the time offset increases from one memory bank to the next by one clock cycle time, which keeps the number of clock cycle offsets as small as possible.

In accordance with an additional mode of the invention, in each case two single-bank commands are combined to form a multibank command. In particular, the multibank commands are formed from a respective first single-bank command, with which information items are forwarded, and a second single-bank command that alters the readiness of a memory cell for exchanging information items. The multibank commands thus formed make it possible for memory cells in two different memory banks alternately to be read from or written to anew. As a result, the writing and reading speed of a memory during a self-test can be doubled compared with many conventional methods of operation.

In accordance with yet another mode of the invention, one single-bank command of the multibank command is preferably a read command or a write command for reading or storing information items. The other single-bank command is preferably an activate command or a precharge command for activating or deactivating a memory cell for reading or storing information items.

With these methods, tests of semiconductor memories having a plurality of memory banks, in particular, self-tests, can be configured more diversely, be developed more cost-effectively, and, under certain circumstances, also be executed more quickly.

Objectives on which the invention is based are achieved with regard to the semiconductor circuit mentioned in the introduction by virtue of the fact that the semiconductor circuit has an additional processor that is connected downstream of the BIST processor and combines the single-bank commands to form multibank commands, as constituents of which the single-bank commands can be executed simultaneously by respective different memory banks.

By virtue of the single-bank commands that are generated with the aid of combining a conventional BIST processor in a suitable manner to form multibank commands and the BIST processor itself being adopted unchanged, it is possible to develop a more diverse test controller in a very inexpensive manner because its circuit can be retained with the exception of the additional processor that is to be newly developed, i.e., that processor that is connected downstream of the BIST subcircuit and combines the single-bank commands to form multibank commands.

With the objects of the invention in view, there is also provided a semiconductor circuit, including a semiconductor memory having memory banks, a BIST (built-in self-test) processor connected to the semiconductor memory and adapted to generate single-bank commands testing individual ones of the memory banks, and a processor connected to the memory and to the BIST processor downstream of the BIST processor with respect to a single-bank command flow direction, the processor adapted to combine the single-bank commands into multibank commands and to simultaneously execute the combined single-bank commands in respective different ones of the memory banks for testing purposes.

With the objects of the invention in view, there is also provided a semiconductor circuit, including a semiconductor memory having memory banks, a BIST processor adapted to generate single-bank commands testing individual ones of the memory banks, and a processor connected to the memory and to the BIST processor downstream of the BIST processor with respect to a single-bank command flow direction, the processor adapted to form a multibank command from at least two of the single-bank commands to effect execution of the at least two single-bank commands simultaneously in at least two respective ones of the memory banks for testing the at least two memory banks.

In accordance with yet a further feature of the invention, the additional processor in each case combines at least two single-bank commands to form a multibank command such that a first single-bank command can be executed by a first memory bank for test purposes even when a further, second single-bank command is executed by a second memory bank for test purposes at the same time.

In accordance with yet an added feature of the invention, the additional processor can be bridged and a self-test can optionally be carried out in a single-bank mode or in a multibank mode. If the additional processor is bridged, then the self-test is carried out in the same way as in a conventional on-chip test controller with the aid of single-bank commands with which only the basic functions of individual memory cells are tested. By contrast, if the additional processor is also used for the self-test, then the functional testing according to the invention in the multibank mode takes place. The testing in the single-bank mode can be used for the routine checking of the memory and the longer testing in the multibank mode can be carried out only in response to particular signals.

In accordance with yet an additional feature of the invention, there is provided a selection unit, which can change over between self-test commands generated on the semiconductor circuit and a line for external commands. Such a multiplexer makes it possible to carry out a test of the semiconductor memory both as self-test with the aid of a BIST circuit and with the aid of an external test device connected to the semiconductor circuit. The line provided for external commands and also a line proceeding from the BIST subcircuit are both connected to inputs of the multiplexer, which selects one of these lines and forwards the commands arriving through the latter to the memory.

In accordance with again another feature of the invention, selection unit is connected downstream of the additional processor. In such a case, the additional processor is situated in the line leading from the BIST circuit to the multiplexer and combines exclusively commands of the command sequences generated by the subcircuit. External commands, by contrast, are conducted directly into the other input of the multiplexer and from there directly to the semiconductor memory. Such an interposition of the additional processor between the BIST subcircuit and the multiplexer leaves open the possibility of testing arbitrary command sequences with the aid of an external test device. As such, the versatility and the speed of the built-in BIST test are increased.

In accordance with a concomitant feature of the invention, the circuit is an Application Specific Integrated Circuit (ASIC), whose semiconductor memory is an embedded Dynamic Random Access Memory (DRAM). Such semiconductor circuits, which are used for diverse purposes, can be tested with the aid of the invention's formation of multibank commands in a more diverse manner separately from application specific circuit environments. As a result, it is possible to ascertain more quickly whether a circuit defect has arisen in the integrated semiconductor memory or in the application specific circuit environment.

With the aid of the semiconductor circuit described above, single-bank commands can be combined to form multibank commands according to one of the methods mentioned above.

Other features that are considered as characteristic for the invention are set forth in the appended claims.

Although the invention is illustrated and described herein as embodied in a test of a semiconductor memory having a plurality of memory banks, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 3A is a signal flow chart illustrating a sequence of single-bank commands according to the prior art; and FIG. 3B is a signal flow chart illustrating the same sequence of single-bank commands and a sequence of multibank commands produced by combining the single-bank commands in accordance with the invention.

DESCRIPTION OF THE PREFERRED EMBODIMENTS

Figure 1:
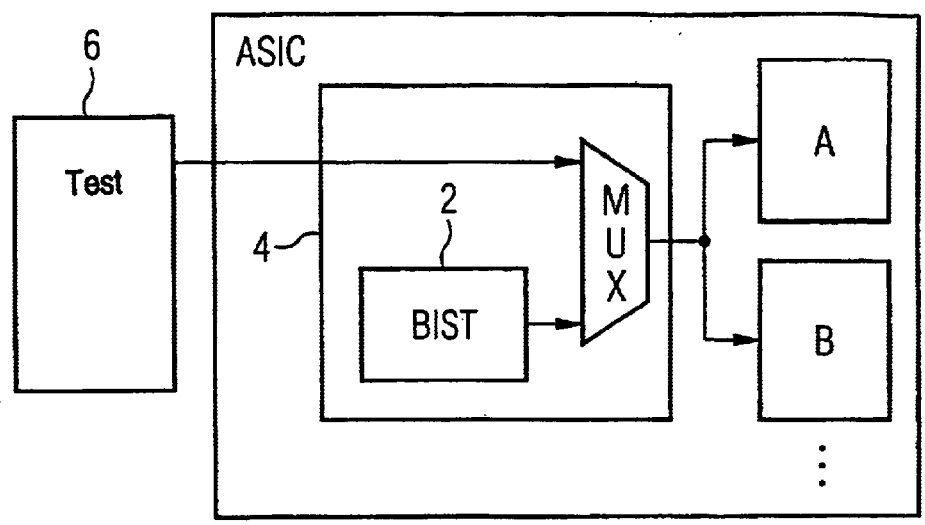
FIG. 1 is a block circuit diagram of a conventional semiconductor circuit with a test controller with a BIST processor.

Referring now to the figures of the drawings in detail and first, particularly to FIG. 1 thereof, there is shown an integrated semi-conductor circuit 1, which may be, for example, an ASIC. The semi-conductor circuit 1 has a memory area including a plurality of memory banks A, B. The memory banks A, B may be integrated for example as embedded DRAM into the semiconductor circuit 1.

The semiconductor circuit 1 has a test controller 4 with which the semiconductor memory can be tested. The central component of the on-chip test controller 4 is a unit 2, which generates an integrated self-test BIST (built-in self-test) in the form of a sequence of suitable commands that are intended to be executed by the semiconductor memory. A multiplexer (MUX) is additionally provided, with which it is possible to select between the on-chip commands generated by the BIST processor 2 and commands generated by an external test device 6. An external test device affords more possibilities of carrying out a test. For routine memory tests, by contrast, the significantly faster self-test with the aid of the BIST processor 2, which can be carried out automatically, is always preferred.

Such a semiconductor circuit in accordance with FIG. 1 is in the prior art.

Figure 2:
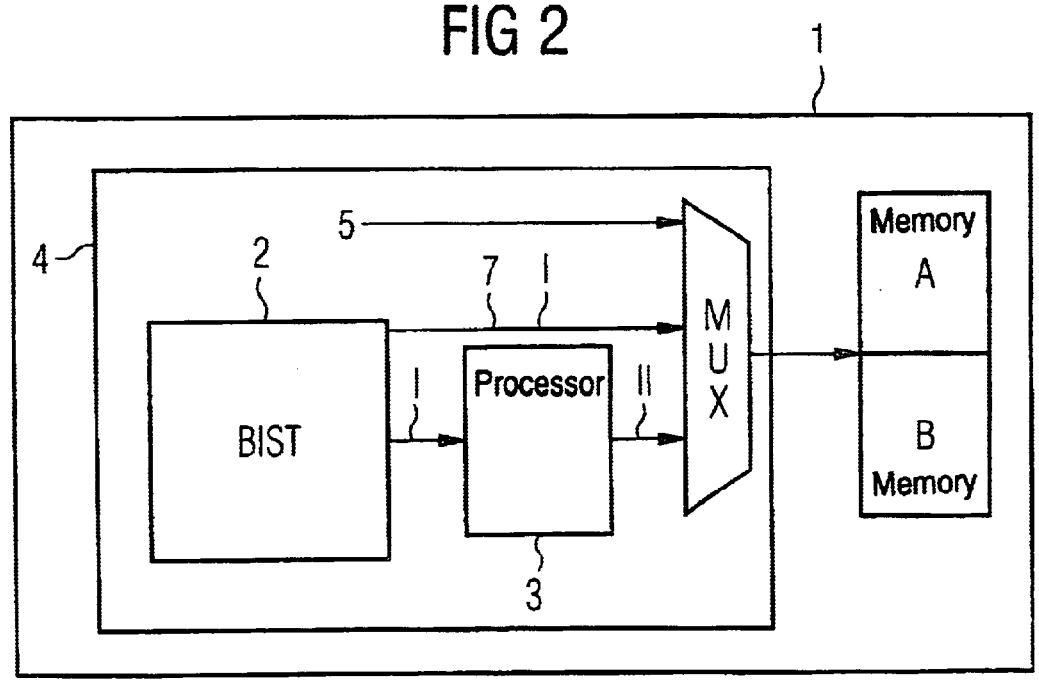
FIG. 2 is a block circuit diagram of a semiconductor circuit according to the invention with a test controller having an additional processor connected downstream of the BIST processor for combining single-bank commands to form multibank commands.

FIG. 2 shows a semiconductor circuit 1 according to the invention, in whose test controller an additional processor 3 is integrated, which converts single-bank commands I generated by the BIST processor 2 into multibank commands II. The multibank commands II can be executed by a plurality of memory banks A, B simultaneously. The method for forming the multibank commands II from the single-bank commands I is described with reference to FIG. 3B.

The test controller 4 furthermore has a lead 5 intended for external test signals and, moreover, a further line 7 that both join further inputs of the multiplexer MUX. The latter can be supplied with external commands, multibank commands II or—in a single-bank mode in which the additional processor 3 is bridged by a line 7—furthermore with single-bank commands I, in each case only a single line being selected and the corresponding commands being forwarded to the memory banks A, B.

FIG. 3A shows a sequence of single-bank commands whose commands are transmitted successively in sequence firstly to a memory bank A and then to a second memory bank B to test these memory banks. The command sequence contains both commands for reading and writing information items, namely read (RD) and write (WR), and commands for activating or deactivating a memory cell, namely activate (ACT) and precharge (PRE). Furthermore, a number of clock cycle times in which no command is executed are provided (NOP; no operation). The single-bank commands are disposed in two rows one below another, and the commands of the first row (1.), which (in this example) are intended to be executed in each case by the memory bank A, are disposed above those in the second command row, which is intended for the memory bank B. The commands of the first and second rows are processed in temporal succession, however, they are presented one below the other only for the sake of simplifying the illustration, because the sequence of single-bank commands that is to be executed by the memory bank A and by the memory bank B is identical for both memory banks.

The activate command in column 1 of the table firstly activates a word line (row 1) of the memory bank A. The write command in column 2 of the table writes a first information item (data 1) through a bit line (column 1) to those memory cells that have been selected by the word line (row 1) and the bit line (column 1) in the memory bank A.

In column 3 of the table, the word line row 1 of the memory bank A is closed again by a precharge command.

In columns 5 to 9, after the activation of another word line (row 2), a further information item (data 2) is written to another memory cell (row 2, col 2) and is firstly read out in column 8 by a read command (RD) before the second word line (row 2) is closed again.

The command sequence of columns 1 to 10 is subsequently transmitted to the memory bank B, further information items (data 3, data 4) being written to the memory bank B.

The command sequence illustrated in FIG. 3A includes exclusively single-bank commands that are successively transmitted to the various memory banks. As a result, it is possible to test only the basic operations on an individual memory bank, i.e., of an individual memory-cell. Commands in which, during the actual operation of the semiconductor memory, a plurality of memory banks are accessed in a different way cannot be tested with such commands.

FIG. 3B shows how a sequence of single-bank commands I generated by the BIST processor can be converted into a sequence of multibank commands II. The command sequence I is identical to that in FIG. 3A, the single-bank commands being listed independently of a specific memory bank A or B. In a post-processor, i.e., an additional processor, these commands are associated with different memory banks A, B and combined to form multibank commands II, which can be executed by the associated memory banks A, B simultaneously. The simultaneous access to different memory banks can be tested with the aid of such multibank commands II.

The activate command in column 1 of the table is assigned to the memory bank A by the additional processor. At this point in time, no command is provided for the memory bank B so that the corresponding command format for such a subcommand, namely NOP (no operation), is not listed separately in column 1, row b. Nevertheless, although the state of the memory bank B is not changed by an NOP command, a single-bank command is no longer present here for the memory bank a, but rather a multibank command (designated just by "ACT" instead of by "ACTNOP" for the sake of brevity) because the NOP instruction is assigned to the memory bank B.

This first multibank command forms the start of a sequence of ten multibank commands II.

In the next clock cycle, which corresponds to column 2 of the table, a first information item (data 1) is written to the memory bank A through the bit line (col 1). At the same time, a word line (row 1) of the memory bank B is activated, which leads to a combined two-bank command activate-write (ACTWR). In such a command, the activate command is assigned to the memory bank B and the write command is assigned to the memory bank A and both assigned commands are combined to form a single two-bank command that can be executed at one and the same clock cycle time.

In the further clock cycle times of columns 3 to 10, the sequence of single-bank commands I listed in row I is assigned once to the memory bank A and is additionally assigned, in a manner offset by one clock cycle time in each case, i.e., by one column, to the memory bank B.

The two-bank command precharge-write (PREWR) includes the precharge command provided in column 3, which is now linked with the memory bank A, and the write command provided in column 2, which is now assigned to the memory bank B in a manner offset by one clock cycle time. The subcommands listed in row II for the memory banks A and B are listed one below the other such that an upper subrow a always contains an activate or precharge command that changes the readiness of a memory cell for the exchange of information items. In a second subrow b underneath, provided that no NOP command is present, there are listed commands for forwarding information items, namely write or read. In column 4, the memory bank B is deactivated; no operation takes place in the memory bank A at this point in time. In rows 5 to 10, the single-bank commands from columns 5 to 9 are assigned to the memory bank A without a delay and are assigned to the memory bank B in a manner delayed by one clock cycle time (columns 6 to 10). This leads, in the columns or at the clock cycle times 6 and 9, to multi-bank commands that change the states of the two memory banks A, B in different ways. In column 6, the memory bank B is activated, while a second information item data 2 is written in the memory bank A. In column 9, the memory bank A is deactivated, and at the same time an information item data 4 is written to the memory bank B.

In the manner described, a set of commands generated in the BIST processor are combined with memory addresses that are likewise supplied by the processor, and are buffer-stored in the logic of the additional processor connected downstream and are combined to form a present multibank command.

The invention's formation of multibank commands exploits the fact that the single-bank commands can be executed simultaneously, provided that they relate to different memory banks. Therefore, more complex interrogations of the integrated semiconductor memory can be carried out in a multibank test mode. The additional processor automatically generates the respective bank addresses and assigns them automatically to the single-bank commands. As can be seen from FIGS. 3A and 3B, the combination to form multibank commands additionally has the advantage that the test duration can be reduced—here, by the factor 2.

Whereas in the conventional command sequence from FIG. 3A columns 1 to 10 have to be traversed twice before each memory bank A, B has been interrogated in this way, by virtue of the combined interrogation with the aid of multibank commands II in FIG. 3B, both memory banks A, B are tested after 10 clock cycle times.

The method according to the invention, which is carried out by an additional processor 3 of the semiconductor circuit illustrated in FIG. 2, has the advantage that a much more complex memory interrogation compared with a BIST processor is possible without the BIST processor having to be completely rejected and redeveloped from scratch. As a result, the development costs for more versatile memory interrogations are kept very low.

We claim:

1. A method for testing a semiconductor memory having a plurality of memory banks, which comprises:

generating respective single-bank commands, each single-bank command for testing a single one of the memory banks and assigning the single-bank commands to selected ones of the memory banks;

combining a plurality of single-bank commands to form multibanks commands, the single-bank commands of the multibank commands being executed simultaneously by the memory banks to which the single-bank commands are respectively assigned; and effecting a test to determine if the selected ones of the memory banks jointly execute the multibank commands.

2. The method according to claim 1, which further comprises effecting a test to determine if a first memory bank correctly executes a first single-bank command even when another second single-bank command is executed by a second memory bank simultaneously.

3. The method according to claim 1, which further comprises forming a sequence of multibank commands, for selected ones of the memory banks configured such that an order of assigned single-bank commands contained in the sequence of multibank commands is identical for each of the selected ones of the memory banks.

4. The method according to claim 1, which further comprises forming the multibank commands by:

assigning single-bank commands to different ones of the memory banks in a clock-cycle-time-offset manner; and combining clock-cycle-time-identical single-bank commands assigned to different ones of the memory banks to form a respective multibank command.

5. The method according to claim 4, which further comprises forming multibank commands executable by N selected memory banks by assigning a sequence of single-bank commands to selected ones of the memory banks in a manner offset by up to N−1 clock cycle times.

6. The method according to claim 1, which further comprises combining exactly two single-bank commands to form a respective single multibank command.

7. The method according to claim 6, which further comprises forming the respective single multibank command from:
  a first single-bank command with which information items are forwarded; and
  a second single-bank command altering a readiness of a memory cell for exchanging information items.

8. The method according to claim 7, wherein one of the first and second single-bank commands is one of a write command and a read command.

9. The method according to claim 8, wherein another of the first and second single-bank commands is one of an activation command and a deactivation command for respectively activating and deactivating a write and read readiness of a memory cell.

10. The method according to claim 7, wherein one of the first and second single-bank commands is one of an activation command and a deactivation command for respectively activating and deactivating a write and read readiness of a memory cell.

11. A method for testing a semiconductor memory having a plurality of memory banks, which comprises:
  generating single-bank commands, each of said single-bank commands respectively accessing a single memory bank and executing the single-bank commands to effect a test determining if each of the single-bank commands are executed correctly by the respective single memory bank;
  creating multibank commands, each multibank command including at least two of the single-bank commands;
  executing each multibank command to simultaneously access at least two of the memory banks; and
  effecting a test to determine if the at least two memory banks correctly execute the at least two single-bank commands simultaneously.

12. The method according to claim 11, which further comprises effecting a test to determine if a first memory bank correctly executes a first single-bank command even when another second single-bank command is executed by a second memory bank simultaneously.

13. The method according to claim 11, which further comprises forming a sequence of multibank commands, for the selected ones of the memory banks configured such that an order of assigned single-bank commands contained in the sequence of multibank commands is identical for each of the selected ones of the memory banks.

14. The method according to claim 11, which further comprises forming the multibank commands by:
  assigning single-bank commands to different ones of the memory banks in a clock-cycle-time-offset manner; and
  combining clock-cycle-time-identical single-bank commands assigned to different ones of the memory banks to form a respective multibank command.

15. The method according to claim 14, which further comprises forming multibank commands executable by N selected memory banks by assigning a sequence of single-bank commands to selected ones of the memory banks in a manner offset by up to N−1 clock cycle times.

16. The method according to claim 11, which further comprises combining exactly two single-bank commands to form a respective single multibank command.

17. The method according to claim 16, which further comprises forming the multibank commands from:
  a first single-bank command with which information items are forwarded; and
  a second single-bank command altering a readiness of a memory cell for exchanging information items.

18. The method according to claim 17, wherein one of the first and second single-bank commands is one of a write command and a read command.

19. The method according to claim 18, wherein another of the first and second single-bank commands is one of an activation command and a deactivation command for respectively activating and deactivating a write and read readiness of a memory cell.

20. The method according to claim 17, wherein one of the first and second single-bank commands is one of an activation command and a deactivation command for respectively activating and deactivating a write and read readiness of a memory cell.

21. A semiconductor circuit, comprising:
  a semiconductor memory having memory banks;
  a BIST processor connected to said semiconductor memory and adapted to generate single-bank commands testing individual ones of said memory banks; and
  a processor connected to said semiconductor memory and to said BIST processor downstream of said BIST processor with respect to a single-bank command flow direction, said processor adapted:
    to combine said single-bank commands into multibank commands; and
    to simultaneously execute said combined single-bank commands in respective different ones of said memory banks.

22. The semiconductor circuit according to claim 21, wherein said processor is adapted to combine at least two of said single-bank commands to form a respective one of said multibank commands such that a first of said combined single-bank commands is executed by a first of said memory banks even when another second one of said combined single-bank commands is executed simultaneously by a second of said memory banks.

23. The semiconductor circuit according to claim 21, wherein said processor is configured with a bridge to selectively carry out a self-test in one of a single-bank test mode and a multibank test mode.

24. The semiconductor circuit according to claim 21, wherein said processor and said BIST processor are each connected to said semiconductor memory such that said processor is bridged to selectively carry out a self-test in one of a single-bank test mode and a multibank test mode.

25. The semiconductor circuit according to claim 21, including:
  a line for conveying external self-test commands; and
  a selection unit connected to said line and at least one of said processor and said BIST processor, said selection unit adapted to select between self-test commands supplied by said line and said at least one of said processor and said BIST processor.

26. The semiconductor circuit according to claim 21, including:
  a line for conveying external self-test commands; and
  a selection unit connected to said line, said processor, and said BIST processor, said selection unit adapted to select between self-test commands supplied by said line and at least one of said processor and said BIST processor.

27. The semiconductor circuit according to claim 25, wherein said selection unit is connected to said processor downstream of said processor in a command flow direction.

28. The semiconductor circuit according to claim 21, wherein said semiconductor memory is an embedded DRAM integrated into an ASIC.

29. The semiconductor circuit according to claim 21, wherein said processor is adapted:
   to combine said single-bank commands to form said multibank commands;
   to execute said combined single bank commands simultaneously in ones of said memory banks to which said single bank commands are respectively assigned; and
   to test if said ones of said memory banks jointly execute said multibank commands.

30. The semiconductor circuit according to claim 21, wherein:
   said BIST processor is adapted:
      to generate said single-bank commands respectively accessing a single one of said memory banks; and
      to execute said single-bank commands to effect a test determining if said single-bank commands are executed correctly by a respective one of said memory banks; and
   said processor is adapted:
      to create said multibank commands including at least two of said single-bank commands;
      to execute said multibank commands to simultaneously access at least two of said memory banks; and
      to test if said at least two of said memory banks correctly execute said at least two of said single-bank commands simultaneously.

31. A semiconductor circuit, comprising:
   a semiconductor memory having memory banks;
   a BIST processor adapted to generate single-bank commands testing individual ones of said memory banks; and
   a processor connected to said semiconductor memory and to said BIST processor downstream of said BIST processor with respect to a single-bank command flow direction, said processor adapted to form a multibank command from at least two of said single-bank commands to effect execution of said at least two single-bank commands simultaneously in at least two respective ones of said memory banks for testing said at least two memory banks.

32. The semiconductor circuit according to claim 31, wherein said processor is adapted to respectively combine at least two of said single-bank commands to form said multibank command such that a first of said at least two single-bank commands is executed by a first of said at least two memory banks even when another second one of said at least two single-bank commands is executed simultaneously by a second of said at least two memory banks.

33. The semiconductor circuit according to claim 31, wherein said processor is configured with a bridge to selectively carry out a self-test in one of a single-bank test mode and a multibank test mode.

34. The semiconductor circuit according to claim 31, wherein said processor and said BIST processor are each connected to said memory such that said processor is bridged to selectively carry out a self-test in one of a single-bank test mode and a multibank test mode.

35. The semiconductor circuit according to claim 31, including:
   a line for conveying external self-test commands; and
   a selection unit connected to said line and at least one of said processor and said BIST processor, said selection unit adapted to select between self-test commands supplied by said line end said at least one of said processor and said BIST processor.

36. The semiconductor circuit according to claim 31, including:
   a line for conveying external self-test commands; and
   a selection unit connected to said line, said processor, and said BIST processor, said selection unit adapted to select between self-test commands supplied by said line and at least one of said processor and said BIST processor.

37. The semiconductor circuit according to claim 35, wherein said selection unit is connected to said processor downstream of said processor in a command flow direction.

38. The semiconductor circuit according to claim 31, wherein said semiconductor memory is an embedded DRAM integrated into an ASIC.

39. The semiconductor circuit according to claim 31, wherein said processor is adapted:
   to combine said single-bank commands to form said multibank command;
   to execute said combined single bank commands simultaneously in ones of said memory banks to which said single bank commands are respectively assigned; and
   to test if said ones of said memory banks jointly execute said multibank command.

40. The semiconductor circuit according to claim 31, wherein:
   said BIST processor is adapted:
      to generate said single-bank commands respectively accessing a single one of said memory banks; and
      to execute said single-bank commands to effect a test determining if said single-bank commands are executed correctly by a respective one of said memory banks; and
   said processor is adapted:
      to create said multibank command including at least two of said single-bank commands;
      to execute said multibank command to simultaneously access at least two of said memory banks; and
      to test if said at least two of said memory banks correctly execute said at least two of said single-bank commands simultaneously.

* * * * *